(12) United States Patent
Su et al.

(10) Patent No.: US 10,509,057 B2
(45) Date of Patent: Dec. 17, 2019

(54) PROBE ASSEMBLY AND PROBE STRUCTURE THEREOF

(71) Applicant: CHUNGHWA PRECISION TEST TECH. CO., LTD., Taoyuan (TW)

(72) Inventors: Wei-Jhih Su, Taichung (TW); Chih-Peng Hsieh, Taipei (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 84 days.

(21) Appl. No.: 15/876,463

(22) Filed: Jan. 22, 2018

(65) Prior Publication Data

US 2019/0072586 A1    Mar. 7, 2019

(30) Foreign Application Priority Data

Sep. 1, 2017 (TW) .............................. 106129986 A

(51) Int. Cl.
*G01R 31/00* (2006.01)
*G01R 1/073* (2006.01)
*G01R 1/067* (2006.01)

(52) U.S. Cl.
CPC ..... *G01R 1/07342* (2013.01); *G01R 1/06761* (2013.01); *G01R 1/07357* (2013.01); *G01R 1/07371* (2013.01); *G01R 1/0675* (2013.01)

(58) Field of Classification Search
CPC .............. H01R 2201/20; H01R 12/714; H01R 13/2435; H01R 13/2471; H01R 13/26; H01R 13/187; H01R 13/24; H01R 13/2442; H01R 12/523; H01R 12/73; H01R 13/17; H01R 13/22; H01R 13/2428; H01R 13/62; H01R 13/631; H01R 13/635; H01R 31/005; H01R 43/20; H01R 43/205; H01R 43/26; G01R 1/06722; G01R 1/07314; G01R 1/06772; G01R 1/06788; G01R 1/07307; G01R 3/00; G01R 1/0466; G01R 1/06711; G01R 1/06733; G01R 1/0735;
(Continued)

(56) References Cited

U.S. PATENT DOCUMENTS 5,977,783 A * 11/1999 Takayama .......... G01R 1/06761
                                                         324/755.01
6,198,300 B1 * 3/2001 Doezema ............... B82Y 35/00
                                                         324/755.07

(Continued)

*Primary Examiner* — Vinh P Nguyen
(74) *Attorney, Agent, or Firm* — Li & Cai Intellectual Property (USA) Office

(57) ABSTRACT

The instant disclosure provides a probe assembly and a probe structure thereof. The probe structure includes a metal main portion, a covering layer and an insulating layer. The metal main portion has a first end portion, a second end portion corresponding to the first end portion, a connecting portion connected between the first and the second end portions and a surrounding surface surrounding the first end portion, the second end portion and the connecting portion. The covering layer includes a first covering layer disposed on a surrounding surface located on the first end portion, a second covering layer disposed on a surrounding surface located on the second end portion and a third covering layer disposed on a surrounding surface located on the connecting portion. The insulating layer is disposed on the third covering layer for exposing the first and second covering layer.

22 Claims, 9 Drawing Sheets

(58) Field of Classification Search
CPC ............ G01R 1/07342; G01R 1/06716; G01R 1/0675; G01R 1/04; G01R 31/045; G01R 31/2891
See application file for complete search history.

(56) References Cited

U.S. PATENT DOCUMENTS

| | | | | |
|---|---|---|---|---|
| 6,573,738 B1* | 6/2003 | Matsuo | .............. | G01R 1/07342 324/755.01 |
| 6,677,245 B2* | 1/2004 | Zhou | .................. | G01R 1/06733 257/E23.021 |
| 2009/0308756 A1* | 12/2009 | Beaman | ............... | G01R 1/0675 205/149 |

\* cited by examiner

PROBE ASSEMBLY AND PROBE STRUCTURE THEREOF

BACKGROUND

1. Technical Field

The instant disclosure relates to a probe assembly and a probe structure thereof, and in particular, to a probe assembly and a probe structure thereof for a probe card of a chip.

2. Description of Related Art

The circular testing probe and rectangular testing probe of microelectromechanical systems in the existing art both have the disadvantages such as poor mechanical property or poor current resistance. The yield of semiconductor processes and testing accuracy are reduced since the properties of the chip probe are unsatisfied. In the existing art, the lifetime of the chip probe is affected by the environment temperature, the mechanical movement and the current resistance, and a testing probe with a single structure cannot avoid the testing error (deviation) resulted from the above factors.

In addition, during the tests performed by the existing chip probes, the chip card provides the testing probe with a momentum such that the testing probe breaks an oxidation layer on the surface of a tin ball for performing the test. However, since the hardness of the existing testing probe is insufficient, mechanical fatigue is often occurred under continuous mechanical movement and the testing probe cannot recover to the original needle shape after being bent. In addition, the existing testing probe made of metals can be damaged after being continuously bent or by the joule heat generated by the supplied current. Moreover, when the testing probe is pressed for breaking the oxidation layer on the surface of the tin ball, a plurality of testing probes arranged in an array would move correspondingly, and since the number of probes in a single array is large, short circuit may be occurred during the movement of the testing probes, thereby alternating the testing result or even damaging the electric circuit related to the testing probes.

Furthermore, since the size of the object to be measured become smaller and smaller, the interval between each of the testing probes which is mainly made of metal materials cannot be too small to prevent the occurrence of short circuits when the testing probes is bent, thereby ensuring the reliability of the probe card. Meanwhile, the heat dissipation property, electrical conductivity and mechanical property of the probe card in the existing art cannot be ensured at the same time. Therefore, there is a need to provide a probe assembly and the probe structure thereof with improved reliability, conductivity, heat dissipation property and/or mechanical strength for overcoming the above disadvantages.

SUMMARY

The object of the instant disclosure is to provide a probe assembly and the probe structure thereof for overcoming the disadvantages of the existing art.

In order to achieve the above object, an embodiment of the instant disclosure provides a probe structure including a metal main portion, a covering layer and an insulating layer. The metal main portion has a first end portion, a second end portion corresponding to the first end portion, a connecting portion connected between the first end portion and the second end portion, and a surrounding surface surrounding the first end portion, the second end portion and the connecting portion. The covering layer includes a first covering layer disposed on the surrounding surface located on the first end portion, a second covering layer disposed on the surrounding layer located on the second end portion and a third covering layer disposed on the surrounding surface located on the connecting portion. The insulating layer is disposed on the first covering layer for exposing the first covering layer and the second covering layer.

Another embodiment of the instant disclosure provides a probe assembly including a bearing seat and a plurality of probe structures. The plurality of probe structures is disposed on the bearing seat, and each of the probe structures includes a metal main portion, a covering layer and an insulating layer. The metal main portion has a first end portion, a second end portion corresponding to the first end portion, a connecting portion connected between the first end portion and the second end portion, and a surrounding surface surrounding the first end portion, the second end portion and the connecting portion. The covering layer includes a first covering layer disposed on the surrounding surface located on the first end portion, a second covering layer disposed on the surrounding surface located on the second end portion, and a third covering layer disposed on the surrounding surface located on the connecting portion. The insulating layer is disposed on the third covering layer for exposing the first covering layer and the second covering layer.

An advantage of the instant disclosure resides in that the reliability, electrical conductivity, heat dissipation property and/or mechanical strength of the probe structure can be improved based on the technical feature of "the covering layer includes a first covering layer disposed on the surrounding surface located on the first end portion, a second covering layer disposed on the surrounding surface located on the second end portion, and a third covering layer disposed on the surrounding surface located on the connecting portion" and "the insulating layer is disposed on the third covering layer for exposing the first covering layer and the second covering layer".

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1A:
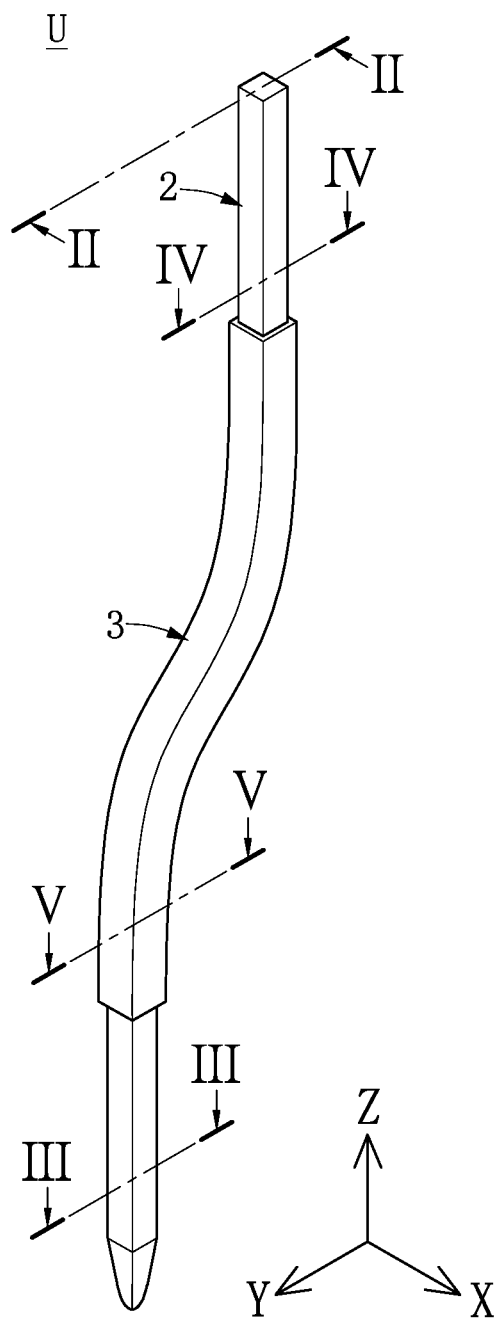
FIG. 1A is a perspective schematic view of the probe structure of a first embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

First Embodiment

Figure 1B:
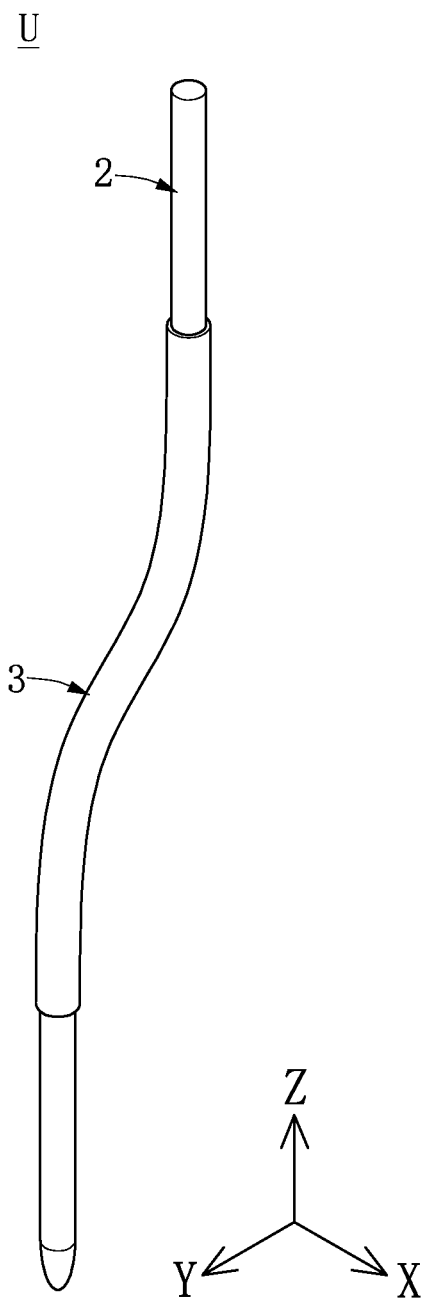
FIG. 1B is another perspective schematic view of the probe structure of a first embodiment of the instant disclosure.
Figure 12:
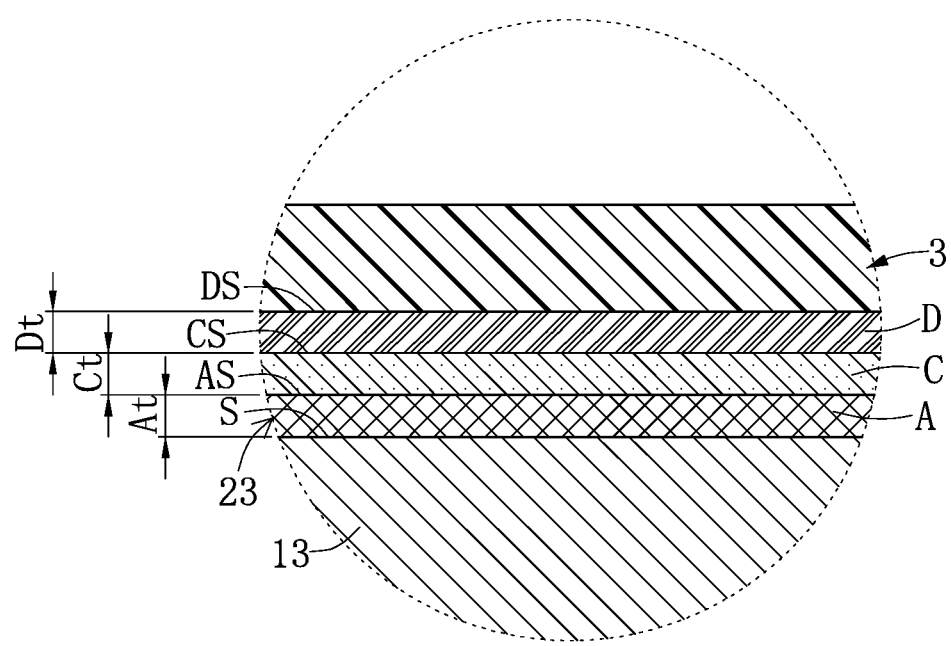
FIG. 12 is a partial enlargement view of another implementation of part XI of FIG. 5.

Reference is made to FIG. 1A, FIG. 1B and FIG. 12. FIG. 1A and FIG. 1B are the perspective schematic views of the probe structures of the embodiments of the instant disclosure, and FIG. 12 is a schematic view of the probe assembly of the embodiments of the instant disclosure. The instant disclosure provides a probe assembly M and the probe structure U thereof. In the first embodiment, the main technical features of the probe structure U are described, while the details regarding the probe assembly M is described later in the second embodiment. In addition, it should be noted that the shape of the probe structure U can be a rectangular column as shown in FIG. 1A, or a cylindrical column as shown in FIG. 1B. The instant disclosure is not limited thereto. In the following description, a probe structure U having a rectangular cross section is selected as an example.

Figure 2:
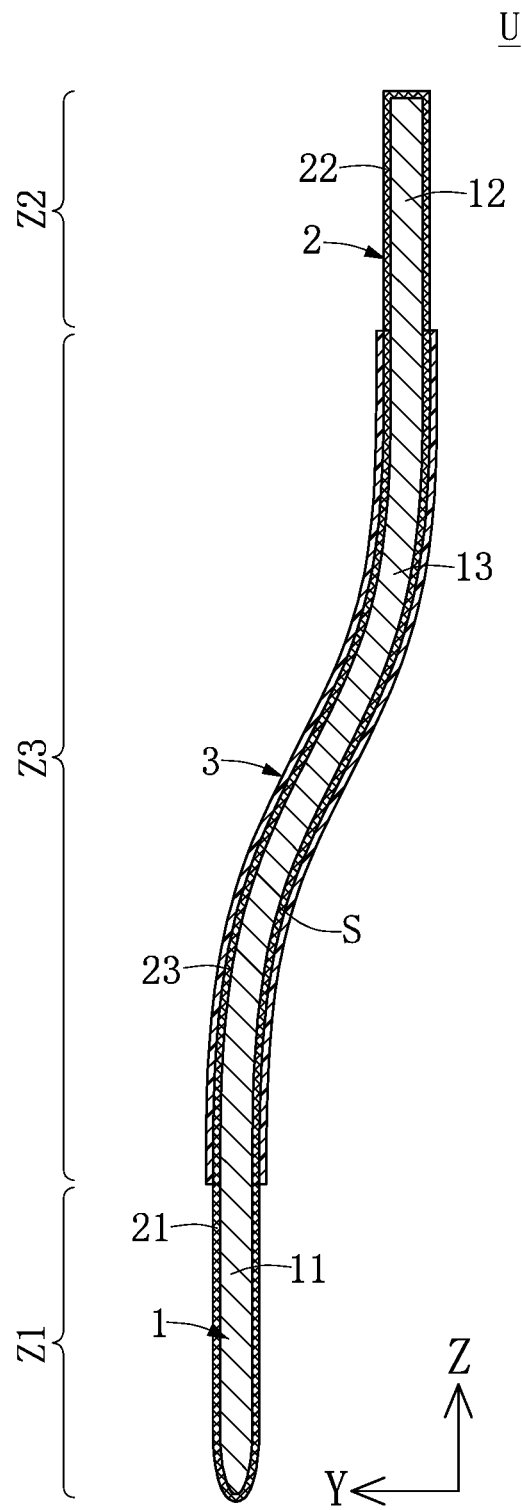
FIG. 2 is a side sectional schematic view taken along the sectional line II-II in FIG. 1A.

Reference is made to FIG. 2. FIG. 2 is a side sectional schematic view taken along the sectional line II-II in FIG. 1A. The probe structure U can include a metal main portion 1, a covering layer 2 and an insulating layer 3. The metal main portion 1 can have a first end portion 11, a second end portion 12 corresponding to the first end portion 11, a connecting portion 13 connected between the first end portion 11 and the second end portion 12 and a surrounding surface S surrounding the first end portion 11, the second end portion 12 and the connecting portion 13. The surrounding surface S is the outer surface of the metal main portion 1. In addition, for example, the first end portion 11 of the metal main portion 1 can have a needle-like shape for breaking an oxidation layer of a tin ball of the object to be measured, and the second end portion 12 can be the needle tail of the probe structure U for being connected to a contact end of the transfer interface substrate.

As shown in FIG. 2 to FIG. 5, the covering layer 2 can include a first covering layer 21 disposed on the surrounding surface S located on the first end portion 11, a second covering layer 22 disposed on the surrounding surface S located on the second end portion 12 and a third covering layer 23 disposed on the surrounding surface S located on the connecting portion 13. In addition, the insulating layer 3 can only be disposed on the third covering layer 23 for exposing the first covering layer 21 and the second covering layer 22. However, the instant disclosure is not limited thereto. In other words, the probe structure U can be divided in to a first area Z1 (i.e., the needle point), a second area Z2 (i.e., the needle tail), and a third area Z3 between the first area Z1 and the second area Z2. The first area Z1 of the probe structure U can have the first end portion 11 and the first covering layer 21 thereon, the second area Z2 can have the second end portion 12 and the second covering layer 22 thereon, the third area Z3 have the connecting portion 13 and the third covering layer 23 thereon.

Figure 3:
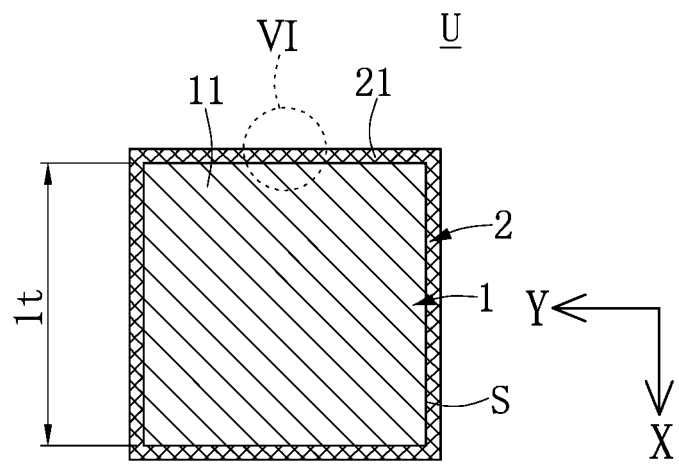
FIG. 3 is a side sectional schematic view taken along the sectional line in FIG. 1A.
Figure 4:
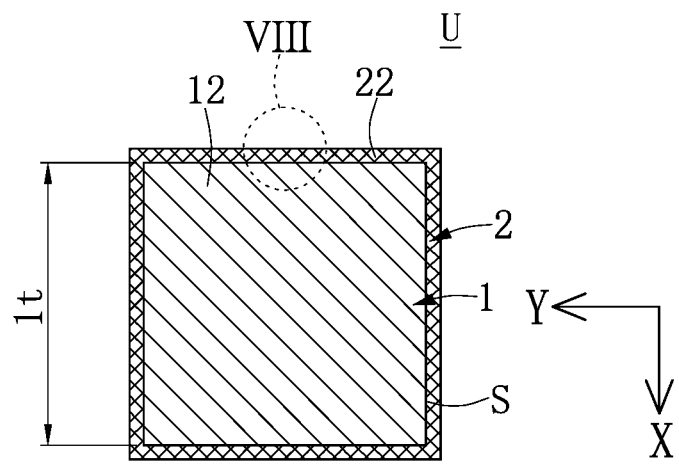
FIG. 4 is a side sectional schematic view taken along the sectional line IV-IV in FIG. 1A.
Figure 5:
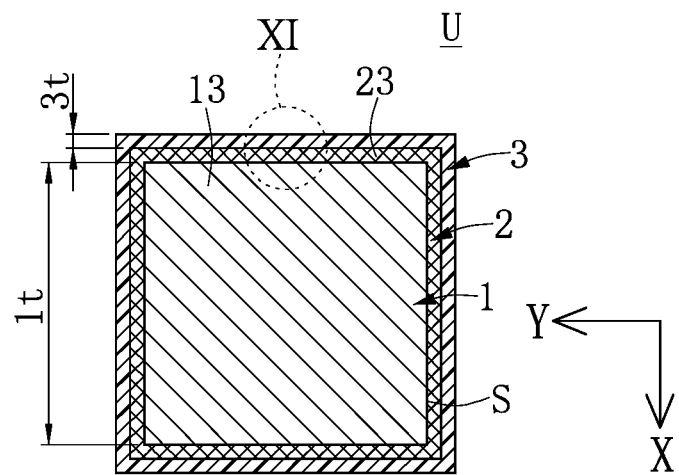
FIG. 5 is a side sectional schematic view taken along the sectional line V-V in FIG. 1A.

In the embodiments of the instant disclosure, preferably, the first covering layer 21 completely surrounds (or covers) the metal main portion 1 as shown in FIG. 3, the second covering layer 22 completely surrounds the metal main portion 1 as shown in FIG. 4, and the third covering layer 23 completely surrounds the metal main portion 1 as shown in FIG. 5. In addition, preferably, the insulating layer 3 completely surrounds the third covering layer 23. For example, the first covering layer 21, the second covering layer 22, the third covering layer 23 and the insulating layer 3 can be formed on the metal main portion 1 by a deposition process. However, the instant disclosure is not limited thereto.

Reference is made to FIG. 2 to FIG. 5. For example, the metal main portion 1 can be formed by a conductive material, and hence, is conductive. The resistivity of the metal main portion 1 can be less than $5\times10^2$ Ωm, and the material of the metal main portion 1 can include but not limited to: gold (Au), silver (Ag), copper (Cu), nickel (Ni), cobalt (Co) and the alloys thereof. Preferably, the material of the metal main portion 1 can be an alloy of copper and cobalt. In addition, the resistivity of the insulating layer 3 can be more than or equal to $10^8$ Ωm, preferably more than or equal to $10^9$ Ωm. The material of the insulating layer 3 can include but not limited to polymer materials such as poly-p-xylene or ceramic materials, preferably, aluminum oxide ($Al_2O_3$). The metal main portion 1 can have a predetermined width $1t$ ranging from 10 μm (micrometer) to 80 μm. The insulating layer 3 can have a predetermined thickness $3t$ ranging from 10 nm (nanometer) to 10 μm. Preferably, the predetermined thickness $3t$ of the insulating layer 3 is from 10 nm to 100 nm or from 0.5 μm to 5 μm. However, the instant disclosure is not limited thereto.

As shown in FIG. 2, in the embodiments of the instant disclosure, the first covering layer 21, the second covering layer 22 and the third covering layer 23 can each be a reinforcing layer, an anti-oxidant layer, a heat dissipation layer or a graphene layer. In addition, in some implementations, the first covering layer 21, the second covering layer 22 and the third covering layer 23 can each be a multilayer structure consisted of two of the following: a reinforcing layer, an anti-oxidant layer, a heat dissipation layer and a graphene layer. However, the instant disclosure is not limited thereto. Preferably, the Young's modulus of the reinforcing layer can be more than 100 GPa. The anti-oxidant layer is a layer having a material surface without activity and having a redox potential (oxidation-reduction potential) more than or equal to −1.66 V. The anti-oxidant layer does not easily react with oxygen for forming oxides. For example, the anti-oxidant layer can be formed by a noble metal (or an anti-corrosion metal) such as gold, silver, palladium or platinum. The thermal conductivity of the heat dissipation layer can be more than 200 W/mK and can be made of aluminum oxide, silicon nitride, copper-aluminum alloy, ceramics or diamond films. In a preferred implementation, two of the first covering layer 21, the second covering layer 22 and the third covering layer 23 have different structures. Therefore, the first covering layer 21, the second covering layer 22, and the third covering layer 23 can be selected and design to have different properties or structures (for example being a single layer or a multilayer structure) for providing different functions.

Figure 6:
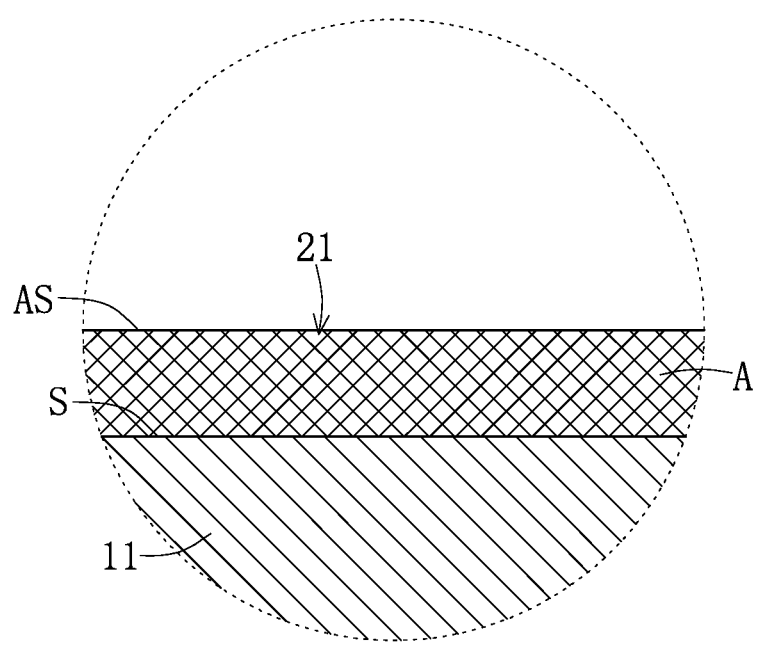
FIG. 6 is a partial enlargement view of an implementation of part VI of FIG. 3.
Figure 7:
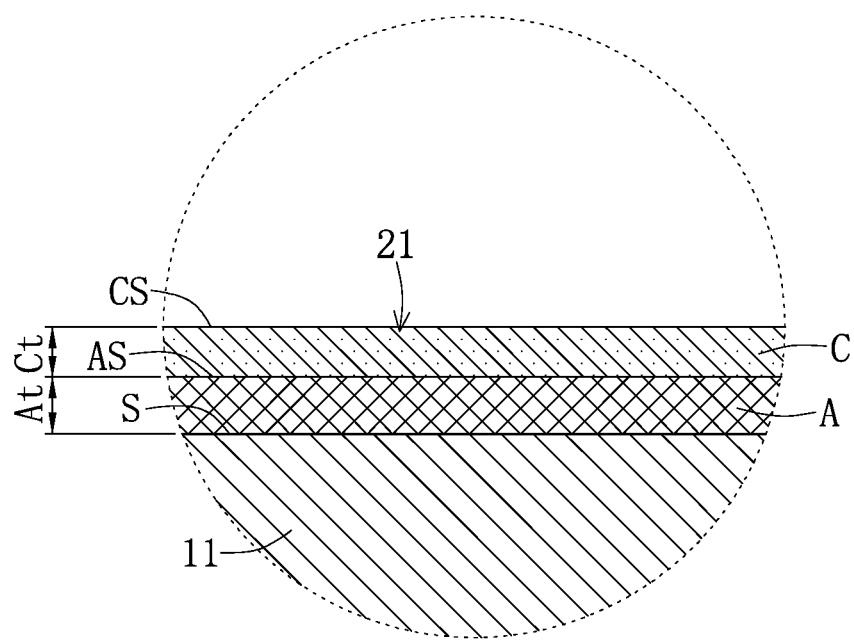
FIG. 7 is a partial enlargement view of another implementation of part VI of FIG. 3.

Reference is made to FIG. 3, FIG. 6 and FIG. 7. FIG. 3 is a side sectional schematic view taken long sectional line in FIG. 1A, and FIG. 6 and FIG. 7 are partial enlargement schematic views of part VI in FIG. 3. The feature related to the first covering layer 21 disposed on the surrounding surface S located on the first end portion 11 is described. It should be noted that FIG. 6 and FIG. 7 do not reflect all of the structures and features shown in part VI of FIG. 3, and are only provided for illustrating the sectional structure of the first end portion 11 of the probe structure U in different implementations.

As shown in FIG. 6, the first covering layer 21 can include a reinforcing layer A which is disposed on the surrounding surface S located on the first end portion 11. The Young's modulus of the reinforcing layer A of the first covering layer 21 is larger than 100 GPa. Preferably, as shown in FIG. 7, the first covering layer 21 can further include a graphene layer C which is disposed on and surrounds an outer surface AS of the reinforcing layer A. It should be noted that the reinforcing layer A can be made of materials with high mechanical strength for increasing the hardness and rigidity of the probe structure U. For example, the reinforcing layer A can be made of an alloy such as an alloy containing rhodium (Rh), platinum (Pt), Iridium (Ir), palladium, nickel and cobalt, silicates or a diamond film. Preferably, the reinforcing layer A is made of a palladium-nickel alloy or a nickel-cobalt alloy. However, the instant disclosure is not limited thereto. Therefore, the use of the reinforcing layer A and/or the graphene layer C can increase the hardness, rigidity, electrical conductivity, heat dissipation property and mechanical property of the probe structure U. In addition, for example, the reinforcing layer A can have a predetermined thickness At ranging from 100 nm to 10 μm. One (1) to ten (10) layers of graphene layers can be used for rendering a predetermined thickness Ct ranging from 0.34 nm to 5 nm. Preferably, the predetermined thickness Ct of the graphene layer C is less than 1 nm. However, the instant disclosure is not limited thereto. It should be noted that although the first covering layer 21 is described as including the reinforcing layer A and/or the graphene layer C, in other implementations, the first covering layer 21 can be a multilayer structure consisted of at least two of a reinforcing layer, an anti-oxidation layer, a heat dissipation layer and a graphene layer different than the structure described above.

Figure 8:
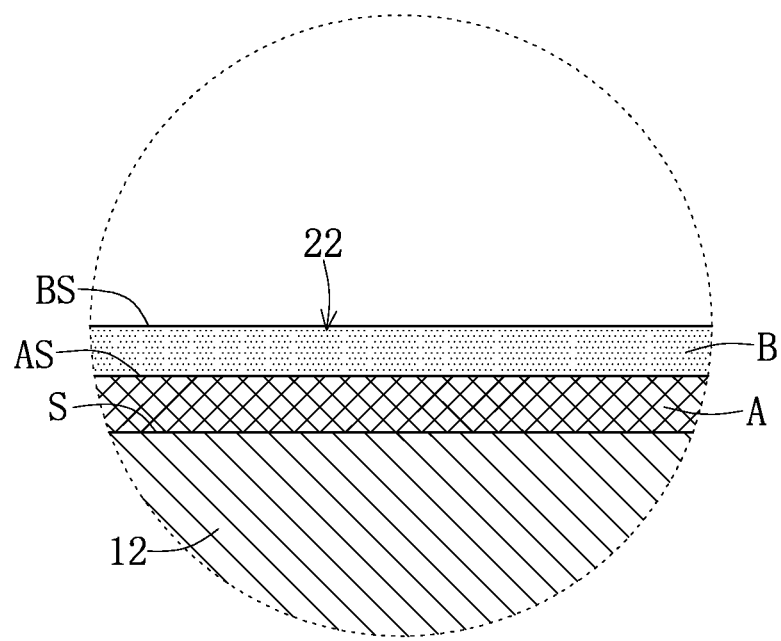
FIG. 8 is a partial enlargement view of an implementation of part VIII of FIG. 4.
Figure 9:
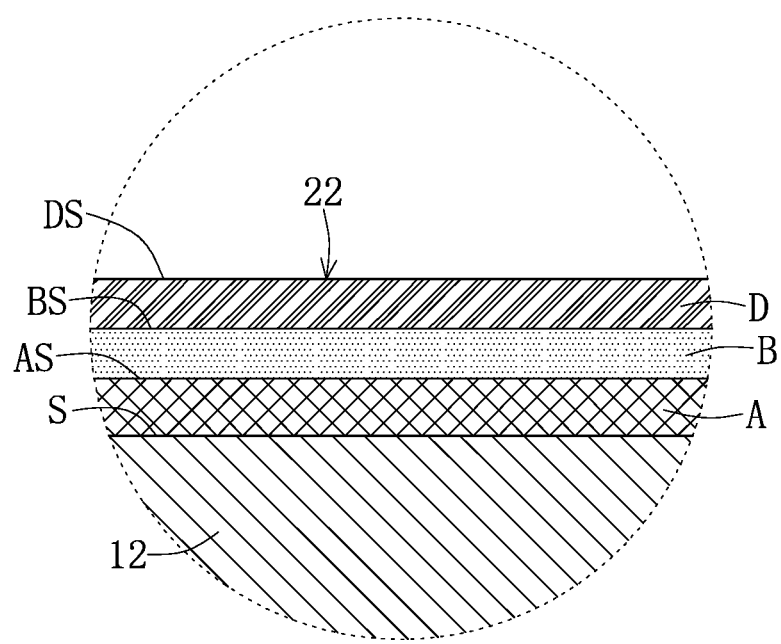
FIG. 9 is a partial enlargement view of another implementation of part VIII of FIG. 4.
Figure 10:
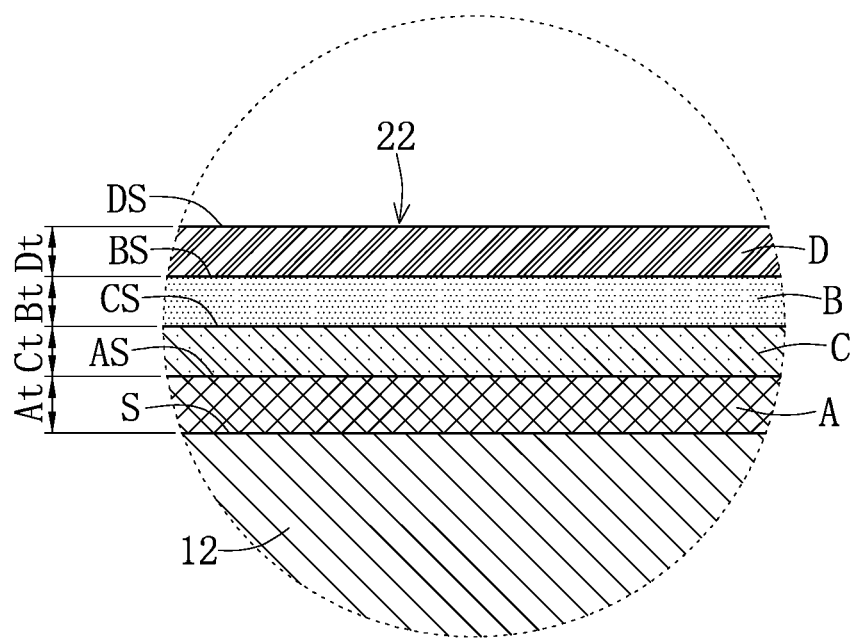
FIG. 10 is a partial enlargement view of yet another implementation of part VIII of FIG. 4.

Reference is made to FIG. 4 and FIG. 8 to FIG. 10. The features regarding the second covering layer 22 disposed on the second end portion 12 located on the surrounding surface S is described herein. In addition, FIG. 4 is a side sectional schematic view taken along line IV-IV in FIG. 4, FIG. 8 to FIG. 10 are partial enlarged views of part VIII in FIG. 4. However, FIG. 8 to FIG. 10 are only schematic views for showing the sectional views of the second end portion 12 of the probe structure U in different implementations.

As shown in FIG. 8, the second covering layer 22 can include a reinforcing layer A and an anti-oxidant layer B. The reinforcing layer A of the second covering layer 22 can be disposed on the surrounding surface S located on the second end portion 12, the anti-oxidant layer B of the second covering layer 22 can be disposed on an outer surface AS of the reinforcing layer A of the second covering layer 22. In addition, the Young's modulus of the reinforcing layer A of the second covering layer 22 is more than 100 GPa, and the material surface of the anti-oxidant layer B of the second covering layer 22 is inert and has a Redox potential of more than or equal to −1.66 V which is not likely to form oxides with oxygen. For example, the anti-oxidant layer B can be made of a noble metal such as gold, silver, palladium or platinum. It should be noted that the properties of the reinforcing layer A of the second covering layer 22 are similar to that of the reinforcing layer A of the first covering layer 21 and are not reiterated herein.

Comparing FIG. 9 with FIG. 8, in other implementations, the second covering layer 22 can further include a heat dissipation layer D disposed on an outer surface BS of the anti-oxidant layer B of the second covering layer 22. The thermal conductivity of the heat dissipation layer D of the second covering layer 22 is more than 200 W/mK. For example, the heat dissipation layer D can be made of aluminum oxide, silicon nitride, copper-aluminum alloy, ceramics or diamond film. However, the instant disclosure is not limited thereto.

Reference is made to FIG. 10. Comparing FIG. 10 with FIG. 9, in other implementations, the second covering layer 22 can further include a graphene layer C which can be disposed between the reinforcing layer A and the anti-oxidant layer B of the second covering layer 22. In other words, the graphene layer C can be disposed on the outer surface AS of the reinforcing layer A of the second covering layer 22, and the anti-oxidant layer B can be disposed on an outer surface CS of the graphene layer C of the second covering layer 22. However, the instant disclosure is not limited thereto. For example, in other implementations, the graphene layer C can be disposed between the heat dissipation layer D and the anti-oxidant layer B of the second covering layer 22.

It should be noted that although the second covering layer 22 described above has the reinforcing layer A, the anti-oxidant layer B, the graphene layer C and/or the heat dissipation layer D, the second covering layer 22 can be a multi-layer structure consisted of more than two of a reinforcing layer A, a anti-oxidant layer B, a heat dissipation layer D and a graphene layer C in other implementations. The order of the arrangement of the reinforcing layer A, the anti-oxidant layer B, the heat dissipation layer D and the graphene layer C can be adjusted based on actual needs.

Therefore, the reinforcing layer A, the anti-oxidant layer B, the graphene layer C and/or the heat dissipation layer D can increase the hardness and rigidity of the probe structure U, thereby increasing the reliability, electrical conductivity, thermal dissipation property and mechanical property of the probe structure U. Furthermore, since the second end portion 12 is for being connected to the contacting end of the transfer substrate, the use of the anti-oxidant layer B can reduce the contacting resistivity and increasing the lifetime of the probe structure U. In addition, for example, the reinforcing layer A can have a predetermined thickness At of from 100 nm to 10 μm; the graphene layer C can have a predetermined thickness Ct of from 0.34 nm to 5 nm, preferably, the predetermined thickness Ct is less than 1 nm; the anti-oxidant layer B can have a predetermined thickness Bt of from 100 nm to 10 μm; the heat dissipation layer D can have a predetermined thickness Dt of from 10 nm to 5 μm. However, the instant disclosure is not limited thereto.

Figure 11:
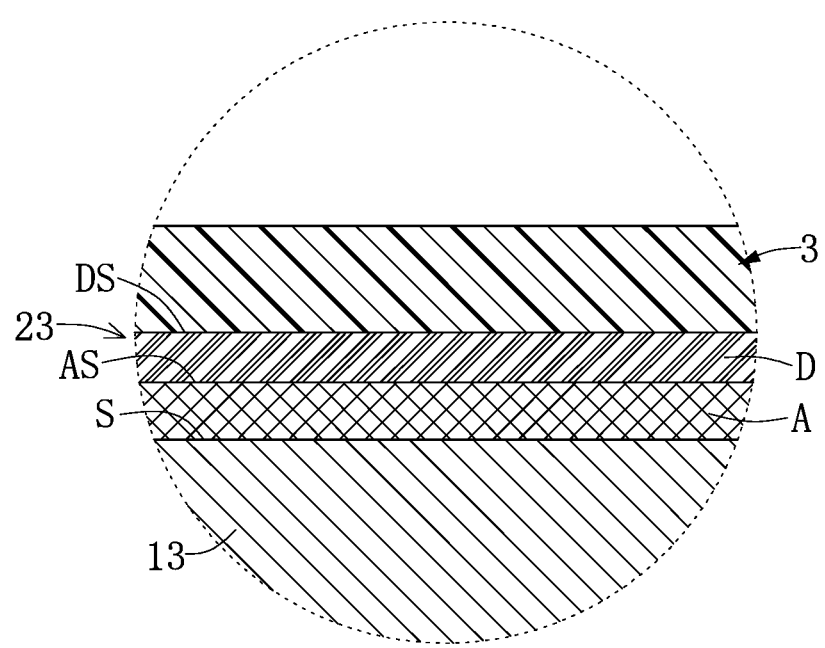
FIG. 11 is a partial enlargement view of an implementation of part XI of FIG. 5.

Reference is made to FIG. 5, FIG. 11 and FIG. 12. The features regarding the third covering layer 23 disposed on the surrounding surface S located on the connecting portion 13 is described herein. In addition, FIG. 5 is a side sectional schematic view taken along line V-V of FIG. 1A, and FIG. 11 and FIG. 12 are partial enlarged views of part XI of FIG. 5. However, it should be noted that FIG. 11 and FIG. 12 are only schematic views for showing the structure of the connecting portion 13 of the probe structure U in different implementations.

As shown in FIG. 11, the third covering layer 23 can include a reinforcing layer A disposed on the surrounding surface S located on the connecting portion 13. The Young's modulus of the reinforcing layer A of the third covering layer 23 is more than 100 GPa. In addition, the third covering layer 23 can further include a heat dissipation layer D disposed on an outer surface AS of the reinforcing layer A and surrounding the outer surface AS. Furthermore, the insulating layer 3 can be disposed on an outer surface DS of the heat dissipation layer D.

Reference is made to FIG. 12. Comparing FIG. 12 with FIG. 11, in other implementations, the third covering layer 23 can further include a graphene layer C disposed between the reinforcing layer A and the heat dissipation layer D of the third covering layer 23. In other words, the graphene layer C can be disposed on the outer surface AS of the reinforcing layer A, and the heat dissipation layer D can be disposed on the outer surface CS of the graphene layer C. In addition, the insulating layer 3 can be disposed on an outer surface DS of the heat dissipation layer D of the third covering layer 23 and surrounding the outer surface DS of the heat dissipation layer D.

In addition, it should be noted that although the third covering layer 23 described above has the reinforcing layer A, the graphene layer C and/or the heat dissipation layer D, the third covering layer 23 can be a multi-layer structure consisted of two or more of the reinforcing layer A, the anti-oxidant layer B, the heat dissipation layer D and a graphene layer C in other implementations. Meanwhile, the order of arrangement of the reinforcing layer A, the anti-oxidant layer B, the heat dissipation layer D and the graphene layer C can be adjusted based on actual needs.

Therefore, the reinforcing layer A, the graphene layer C and/or the heat dissipation layer D can increase the hardness and rigidity of the probe structure U, thereby increasing the reliability, electrical conductivity, thermal dissipation property and mechanical property of the probe structure U. The use of the reinforcing layer A can increase the recovery ability of the probe structure U after subjected to a force and being bent. Meanwhile, since heat is accumulated at the connecting portion 13 of the probe structure U, the used of the heat dissipation layer D can increase the heat dissipation property of the probe structure U. In addition, for example, the reinforcing layer A can have a predetermined thickness At of from 100 nm to 10 μm; the graphene layer C can have a predetermined thickness Ct of from 0.34 nm to 5 nm, preferably, the predetermined thickness Ct is less than 1 nm; the heat dissipation layer D can have a predetermined thickness Dt of from 10 nm to 5 μm. However, the instant disclosure is not limited thereto.

It should be noted that in a preferable implementation, the first covering layer 21 on the first area Z1 can have the reinforcing layer A and the graphene layer C as showing in FIG. 7, the second covering layer 22 on the second area Z2 can have the reinforcing layer A, the graphene layer C, the anti-oxidant layer B and the heat dissipation layer D as shown in FIG. 10, the third covering layer 23 on the third area Z3 can have a reinforcing layer A, a graphene layer C and a heat dissipation layer D as shown in FIG. 12. However, in other implementation, the first area Z1, the second area Z2 and the third area Z3 can be designed to be without the graphene layer C. The instant disclosure is not limited thereto.

Second Embodiment

Figure 13:
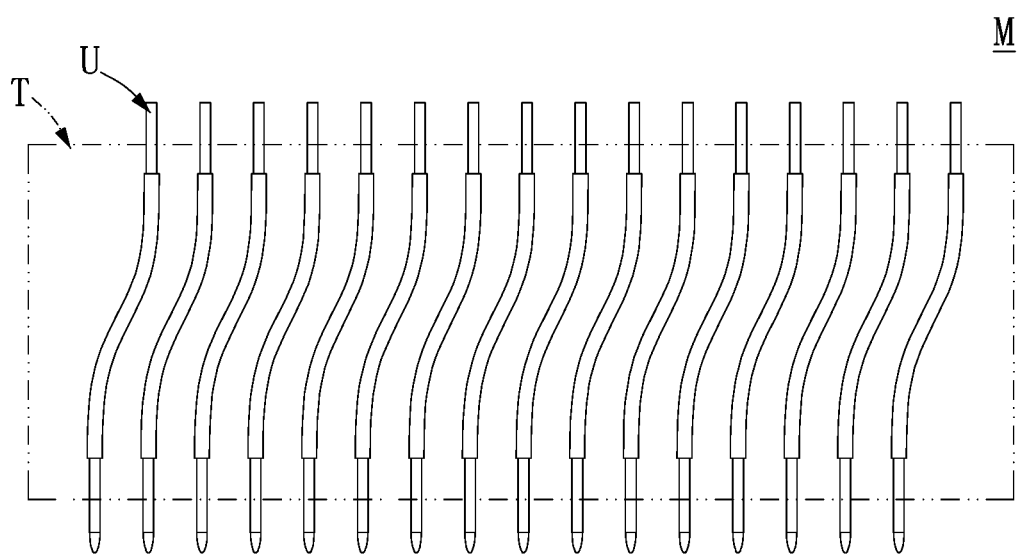
FIG. 13 is a schematic view of the probe assembly of a second embodiment of the instant disclosure.

Reference is made to FIG. 13. Reference is further made to FIG. 2 to FIG. 5 if necessarily. FIG. 13 is the schematic view of the probe assembly of the second embodiment of the instant disclosure. The second embodiment of the instant disclosure provides a probe assembly M including a bearing seat T and a plurality of probe structures U. The plurality of probe structures U can be disposed on the bearing seat T according to the measuring array of the probe card.

As shown in FIG. 2 to FIG. 5, each of the probe structures U can include a metal main portion 1, a covering layer 2 and an insulating layer 3. The metal main portion 1 has a first end portion 11, a second end portion 12 corresponding to the first end portion 11, a connecting portion 13 connected between the first end portion 11 and the second end portion 12, and a surrounding surface S surrounding the first end portion 11, the second end portion 12 and the connecting portion 13. In addition, the covering layer 2 includes a first covering layer 21 disposed on the surrounding surface S located on the first end portion 11, a second covering layer 22 disposed on the surrounding surface S located on the second end portion 12 and a third covering layer 23 disposed on the surrounding surface S located on the connecting portion 13. The insulating layer 3 is disposed on the third covering layer 23 for exposing the first covering layer 21 and the second covering layer 22. Therefore, since the insulating layer 3 is located on the outmost layer of the probe structure U, the insulating layer 3 can avoid the electrical contact between the adjacent probe structures U from occurring, thereby preventing short circuits.

It should be noted that the properties of the metal main portion 1, the covering layer 2 and the insulating layer 3 of the second embodiment are similar to that of the previous embodiment and are not reiterated herein. In other words, the first covering layer 21, the second covering layer 22 and the third covering layer 23 provided by the second embodiment can optionally include the reinforcing layer A, the anti-oxidant layer B, the graphene layer C and/or the heat dissipation layer D as described in the previous embodiment.

Effectiveness of the Embodiments

One of the advantages of the instant disclosure is that the probe assembly M and the probe structure U thereof provided by the embodiments of the instant disclosure can increase the reliability, the electrical conductivity, the heat dissipation property and/or the mechanical strength of the probe structure U based on the technical feature of "the covering layer 2 includes a first covering layer 21 disposed on the surrounding surface S located on the first end portion 11, a second covering layer 22 disposed on the surrounding surface S located on the second end portion 12 and a third covering layer 23 disposed on the surrounding surface S located on the connecting portion 13" and "the insulating layer 3 is disposed on the third covering layer 23 for exposing the first covering layer 21 and the second covering layer 22". In other words, the sectional design of the probe structure U enables each of the locations (the first area Z1, the second area Z2 and the third area Z3) of the probe structure U can overcome the problems of current resistance, mechanical property, heat dissipation and insulation respectively, thereby improving the mechanical strength, the heat dissipation property and the performance and lifetime of the probe. Besides, according to the use of the insulating layer 3, the electrical contacts between adjacent probe structures U in the probe assembly M can be prevented, thereby avoiding the occurrence of short circuits.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A probe assembly, including:
   a metal main portion having a first end portion, a second end portion corresponding to the first end portion, a connecting portion connected between the first end portion and the second end portion, and a surrounding surface surrounding the first end portion, the second end portion and the connecting portion;
   a covering layer including a first covering layer disposed on the surrounding surface located on the first end portion, a second covering layer disposed on the surrounding layer located on the second end portion and a third covering layer disposed on the surrounding surface located on the connecting portion; and
   an insulating layer disposed on the third covering layer for exposing the first covering layer and the second covering layer;
   wherein the first covering layer includes a reinforcing layer, and the reinforcing layer of the first covering layer is disposed on the surrounding surface located on the first end portion, wherein the Young's modulus of the reinforcing layer of the first covering layer is more than 100 GPa.

2. The probe structure according to claim 1, wherein the insulating layer has a resistivity of more than or equal to $10^8$ $\Omega$m.

3. The probe structure according to claim 2, wherein the metal main portion has conductivity, and the resistivity of the metal main portion is less than $5 \times 10^2$ $\Omega$m.

4. The probe structure according to claim 1, wherein the metal main portion has conductivity, and the resistivity of the metal main portion is less than $5 \times 10^2$ $\Omega$m.

5. The probe structure according to claim 1, wherein the second covering layer or the third covering layer each is a reinforcing layer, an anti-oxidant layer, a heat dissipation layer or a graphene layer, wherein the Young's modulus of the reinforcing layer is more than 100 GPa, the redox potential of the anti-oxidant layer is more than or equal to −1.66 V, and the thermal conductivity of the heat dissipation layer is more than 200 W/mK.

6. The probe structure according to claim 1, wherein the first covering layer, the second covering layer or the third covering layer each is multilayer structure consisted by at least two of a reinforcing layer, an anti-oxidant layer, a heat dissipation layer and a graphene layer, wherein the Young's modulus of the reinforcing layer is more than 100 GPa, the redox potential of the anti-oxidant layer is more than or equal to −1.66 V, and the thermal conductivity of the heat dissipation layer is more than 200 W/mK.

7. The probe structure according to claim 1, wherein two of the first covering layer, the second covering layer and the third covering layer have different structures.

8. The probe structure according to claim 1, wherein the first covering layer further includes a graphene layer, and the graphene layer of the first covering layer is disposed on an outer surface of the reinforcing layer of the first covering layer.

9. The probe structure according to claim 1, wherein the second covering layer includes a reinforcing layer, and the reinforcing layer of the second covering layer is disposed on the surrounding surface located on the second end portion, wherein the Young's modulus of the reinforcing layer of the second covering layer is more than 100 GPa.

10. The probe structure according to claim 9, wherein the second covering layer further includes an anti-oxidant layer, the anti-oxidant layer being disposed on an outer surface of the reinforcing layer of the second covering layer, the redox potential of the anti-oxidant layer being more than or equal to −1.66 V.

11. The probe structure according to claim 10, wherein the second covering layer further includes a heat dissipation layer, the heat dissipation layer being disposed on an outer surface of the anti-oxidant layer of the second covering layer, the thermal conductivity of the heat dissipation layer of the second covering layer is more than 200 W/mK.

12. The probe structure according to claim 11, wherein the second covering layer further includes a graphene layer, the graphene layer of the second covering layer being disposed between the reinforcing layer of the second covering layer and the anti-oxidant layer of the second covering layer.

13. The probe structure according to claim 1, wherein the third covering layer includes a reinforcing layer, the reinforcing layer of the third covering layer being disposed on the surrounding surface located on the connecting portion, wherein the Young's modulus of the reinforcing layer of the third covering layer is more than 100 GPa.

14. The probe structure according to claim 13, wherein the third covering layer further includes a heat dissipation layer, the heat dissipation layer of the third covering layer being disposed on an outer surface of the recinforcing layer of the third covering layer.

15. The probe structure according to claim 14, wherein the third covering layer further includes a graphene layer, the graphene layer of the third covering layer being disposed between the reinforcing layer of the third covering layer and the heat dissipation layer of the third covering layer, wherein the insulating layer is disposed on an outer surface of the heat dissipation layer.

16. A probe assembly, including:
   a bearing seat; and
   a plurality of probe structures disposed on the bearing seat, each of the probe structures includes a metal main portion, a covering layer and an insulating layer;
   wherein the metal main portion has a first end portion, a second end portion corresponding to the first end portion, a connecting portion connected between the first end portion and the second end portion, and a surrounding surface surrounding the first end portion, the second end portion and the connecting portion;
   wherein the covering layer includes a first covering layer disposed on the surrounding surface located on the first end portion, a second covering layer disposed on the surrounding surface located on the second end portion, and a third covering layer disposed on the surrounding surface located on the connecting portion;

wherein the insulating layer is disposed on the third covering layer for exposing the first covering layer and the second covering layer;

wherein the first covering layer includes a reinforcing layer, and the reinforcing layer of the first covering layer is disposed on the surrounding surface located on the first end portion, wherein the Young's modulus of the reinforcing layer of the first covering layer is more than 100 GPa.

17. The probe assembly according to claim 16, wherein the insulating layer has a resistivity of more than or equal to $10^8$ Ωm.

18. The probe assembly according to claim 17, wherein the metal main portion is conductive and has a resistivity of less than $5\times10^2$ Ωm.

19. The probe assembly according to claim 16, wherein the metal main portion is conductive and has a resistivity of less than $5\times10^2$ Ωm.

20. The probe assembly according to claim 16, wherein the second covering layer and the third covering layer each is a reinforcing layer, an anti-oxidant layer, a heat dissipation layer or a graphene layer, wherein the Young's modulus of the reinforcing layer is more than 100 GPa, the redox potential of the anti-oxidant layer is more than or equal to −1.66 V, and the thermal conductivity of the heat dissipation layer is more than 200 W/mK.

21. The probe assembly according to claim 16, wherein the first covering layer, the second covering layer and the third covering layer each is multilayer structure consisted by at least two of a reinforcing layer, an anti-oxidant layer, a heat dissipation layer and a graphene layer, wherein the Young's modulus of the reinforcing layer is more than 100 GPa, the redox potential of the anti-oxidant layer is more than or equal to −1.66 V, and the thermal conductivity of the heat dissipation layer is more than 200 W/mK.

22. The probe assembly according to claim 16, wherein two of the first covering layer, the second covering layer and the third covering layer have different structures.

* * * * *